United States Patent
Chou et al.

(10) Patent No.: US 7,130,958 B2
(45) Date of Patent: Oct. 31, 2006

(54) SERIAL INTERFACE TO FLASH-MEMORY CHIP USING PCI-EXPRESS-LIKE PACKETS AND PACKED DATA FOR PARTIAL-PAGE WRITES

(75) Inventors: Horng-Yee Chou, Palo Alto, CA (US); Ben Wei Chen, Fremont, CA (US)

(73) Assignee: Super Talent Electronics, Inc., San Jose, CA (US)

(*) Notice: Subject to any disclaimer, the term of this patent is extended or adjusted under 35 U.S.C. 154(b) by 493 days.

(21) Appl. No.: 10/708,096

(22) Filed: Feb. 9, 2004

(65) Prior Publication Data

US 2005/0120163 A1   Jun. 2, 2005

Related U.S. Application Data

(63) Continuation-in-part of application No. 10/707,277, filed on Dec. 2, 2003, and a continuation-in-part of application No. 10/707,276, filed on Dec. 2, 2003, now Pat. No. 7,073,010.

(51) Int. Cl.
*G06F 12/00* (2006.01)
(52) U.S. Cl. .............................. 711/103; 710/5; 710/313
(58) Field of Classification Search .................. None
See application file for complete search history.

(56) References Cited

U.S. PATENT DOCUMENTS

| | | | | |
|---|---|---|---|---|
| 5,430,859 A | * | 7/1995 | Norman et al. | 711/103 |
| 5,822,251 A | * | 10/1998 | Bruce et al. | 365/185.13 |
| 5,835,936 A | * | 11/1998 | Tomioka et al. | 711/103 |
| 6,611,537 B1 | * | 8/2003 | Edens et al. | 370/503 |
| 6,839,285 B1 | * | 1/2005 | Zink et al. | 365/185.33 |
| 2003/0093606 A1 | * | 5/2003 | Mambakkam et al. | 710/305 |
| 2003/0142227 A1 | * | 7/2003 | van Zee | 348/333.1 |
| 2003/0145141 A1 | * | 7/2003 | Chen et al. | 710/74 |

* cited by examiner

*Primary Examiner*—T Nguyen
(74) *Attorney, Agent, or Firm*—gPatent LLC; Stuart T. Auvinen

(57) ABSTRACT

A serial flash-memory chip has a serial-bus interface to an external controller. A flash-memory block in the serial flash-memory chip can be read by the external controller sending a read-request packet over the serial bus to the serial flash-memory chip, which reads the flash memory and sends the data back in a data-payload field in a completion packet. Data in a write-request packet is written to the flash memory, and a message packet sent back over the serial bus. The serial bus can be a Peripheral Component Interconnect (PCI) Express bus with bi-directional pairs of differential lines. Packets have modified-PCI-Express headers that define the packet type and data-payload length. Vendor-defined packets can send flash commands such as reset, erase, or responses after operations such as program or erase. A serial engine and microcontroller or state machine are on the serial flash-memory chip.

21 Claims, 14 Drawing Sheets

| TLP Type | FMT[1:0] | Type[4:0] | Description |
|---|---|---|---|
| Memory-Read | 00<br>01 | 00000 | Memory Read Request |
| Memory-Write | 10<br>11 | 00000 | Memory Write Request |
| Configuration-Read | 00 | 00101 | Configuration Read Request |
| Configuration-Write | 10 | 00101 | Configuration Write Request |
| Message | 01 | 10RRR | Message Request |
| Completion-Data | 10 | 01010 | Completion with Data |

FIG. 6

| Flash Memory Commands | Request Packet Type | Response Packet Type |
|---|---|---|
| Read | Mem Read Request | Completion with Data |
| Read for Copy Back | Mem Read Request for 1 word | Completion with Status Data |
| Read ID | Configuration Read | Completion with Data |
| Reset | Message Request | Not needed |
| Program | Mem Write Request | Message Request |
| Cache Program | Mem Write Request | Message Request |
| Copy-Back Program | Mem Write Request for 1 word | Message Request |
| Erase | Message Request | Message Request |
| Read status register | Configuration Read | Completion with Data |

FIG. 7

VENDOR-DEFINED MESSAGE

COMPLETION PKT HEADER

CONFIGURATION REQUEST

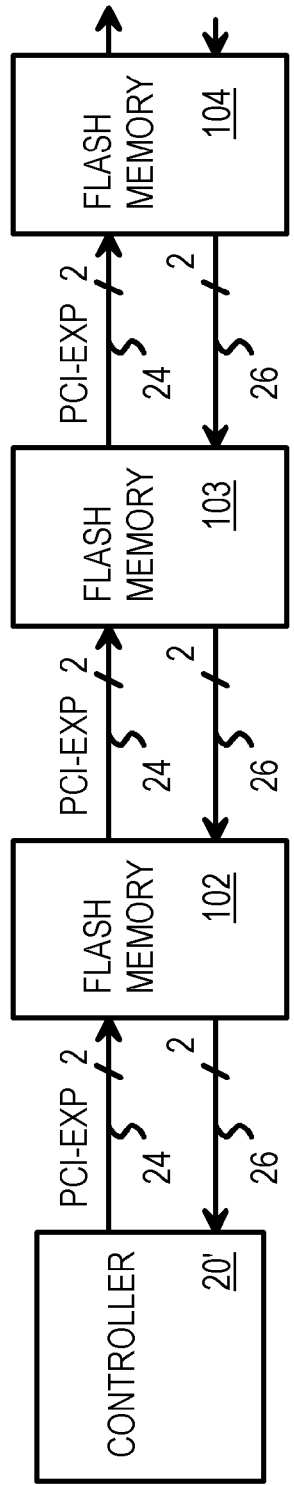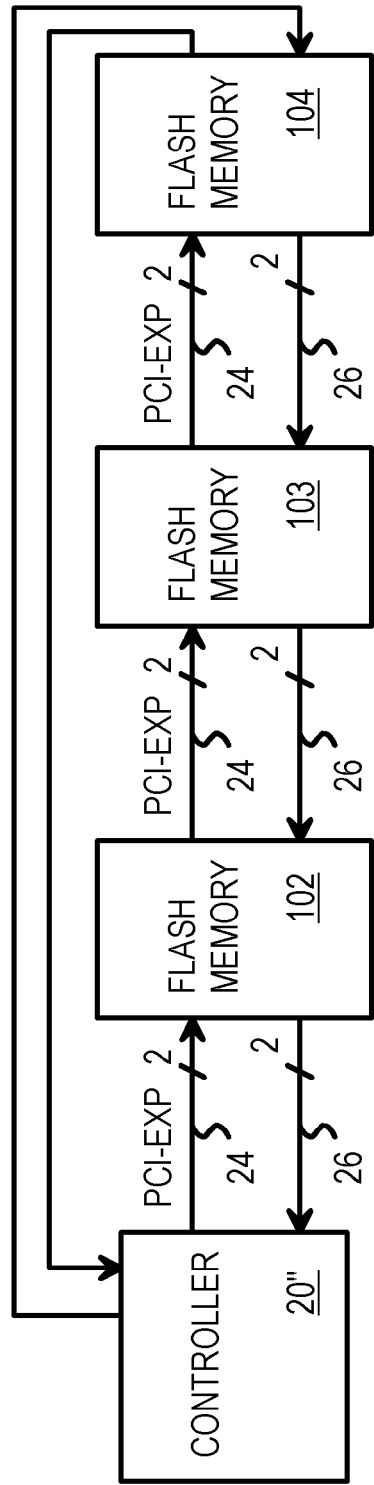

US 7,130,958 B2

SERIAL INTERFACE TO FLASH-MEMORY CHIP USING PCI-EXPRESS-LIKE PACKETS AND PACKED DATA FOR PARTIAL-PAGE WRITES

CROSS REFERENCE TO RELATED APPLICATIONS

This application is a continuation-in-part of the co-pending application for "Single-Chip USB Controller Reading Power-On Boot Code from Integrated Flash Memory for User Storage", U.S. Ser. No. 10/707,277, filed Dec. 2, 2003, which is related to the application for "USB Smart Switch with Packet Re-Ordering for Interleaving among Multiple Flash-Memory Endpoints Aggregated as a Single Virtual USB Endpoint", U.S. Ser. No. 10/707,276, filed Dec. 2, 2003 now U.S. Pat No. 7,073,010.

BACKGROUND OF INVENTION

This invention relates to flash-memory chips, and more particularly to a serial-bus interface to a flash memory chip.

Flash memory has gained wide acceptance for its non-volatile storage, which is ideal for portable devices that may lose power, since the data is not lost when stored in the flash memory. Flash memories are constructed from electrically-erasable programmable read-only memory (EEPROM) cells.

Rather than use a randomly-addressable scheme such as is common with dynamic-random-access memory (DRAM), many flash memories use a block-based addressing where a command and an address are sent over the data bus and then a block of data is read or written.

Since the data bus is also use to send commands and addresses, fewer pins are needed on the flash-memory chip, reducing cost. Thus flash memory is often used as a mass-storage device rather than a randomly-addressable device.

Universal-Serial-Bus (USB) has become a popular standard interface for connecting peripherals to a host such as a personal computer (PC). Peripheral Component Interconnect (PCI), Personal-Computer Memory Card International Association (PCMCIA) and PCI-Express are other bus and card standards. USB-based flash-memory storage devices or "drives" have been developed to transport data from one host to another, replacing floppy disks. While large external flash drives may be used, smaller USB flash drives known as key-chain or key drives have been a rapidly growing market.

A USB flash-memory device such as a key drive can be constructed from a microcontroller, a flash-memory controller or interface, and one or more flash-memory chips.

A serial interface on the microcontroller connects to the USB bus to the host, and data from the serial interface is transferred through the microcontroller to the flash controller and then written to the flash-memory chips.

FIG. 1 shows a prior-art interface to a flash-memory chip. Flash-memory chip 12 has 8-bit I/O bus 14 that connects to controller 10. Controller 10 could be a microcontroller in a flash drive or a flash-memory card. Address, data, and commands are sent over 8-bit I/O bus 14 to flash-memory chip 12 using time-multiplexing. Eight bits of address, data, or command information can be transferred in parallel at a time over 8-bit I/O bus 14.

Several control signals on control bus 16 are used to coordinate transfer of address, data, and commands over 8-bit I/O bus 14. For example, an address-strobe signal can indicate when address signals can be latched into flash-memory chip 12, and a data strobe can indicate when data from flash-memory chip 12 can be latched by controller 10.

Although 8-bit I/O bus 14 is much more compact than if separate address and data buses were used, for some applications even the 8-bit bus is less than ideal. When the pins needed by 8-bit I/O bus 14 and flash-memory chip 12 are counted, as many as 16 signal pins are used for the interface to flash-memory chip 12. Several power and ground pins may be needed, so the total pin count of flash-memory chip 12 is over 20 pins. Also, these 20 pins need to be added to controller 10, increasing its pin count.

While chips with 20 or 30 pins are acceptable for many applications, some applications are more sensitive and could benefit by a further reduced pin count. For example, small devices such as flash-memory cards and flash drives are very small and benefit from further reductions in the pin counts, since a reduced pin count can reduce chip package sizes of both flash-memory chip 12 and controller 10, and can reduce the wiring needed and the size of a printed-circuit board (PCB) that flash-memory chip 12 and controller 10 are mounted on.

The parent application disclosed a USB single-chip flash device. The single-chip device included a microcontroller and a flash memory block. The pin count of the single-chip device was reduced since a USB serial interface was used to access the single-chip device and its flash memory.

What is desired is to reduce the pin count of a flash-memory chip by using a serial interface rather than a parallel interface. A serial interface to a flash-memory chip is desirable. A serial interface using packets to access a flash-memory chip is desirable. It is desired to modify a standardized serial interface for use with a flash-memory chip. A specialized serial interface to a flash-memory chip that is based on a standard serial-bus interface is desirable.

BRIEF DESCRIPTION OF DRAWINGS

FIG. 6 is a table of transaction-layer packet types used for communicating with the serial flash-memory chip.

FIG. 7 is a table of request and response packets used for various flash-memory commands.

FIGS. 13A–B show daisy-chain expansion with multiple serial flash-memory chips.

DETAILED DESCRIPTION

The present invention relates to an improvement in flash-memory chips. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2A:
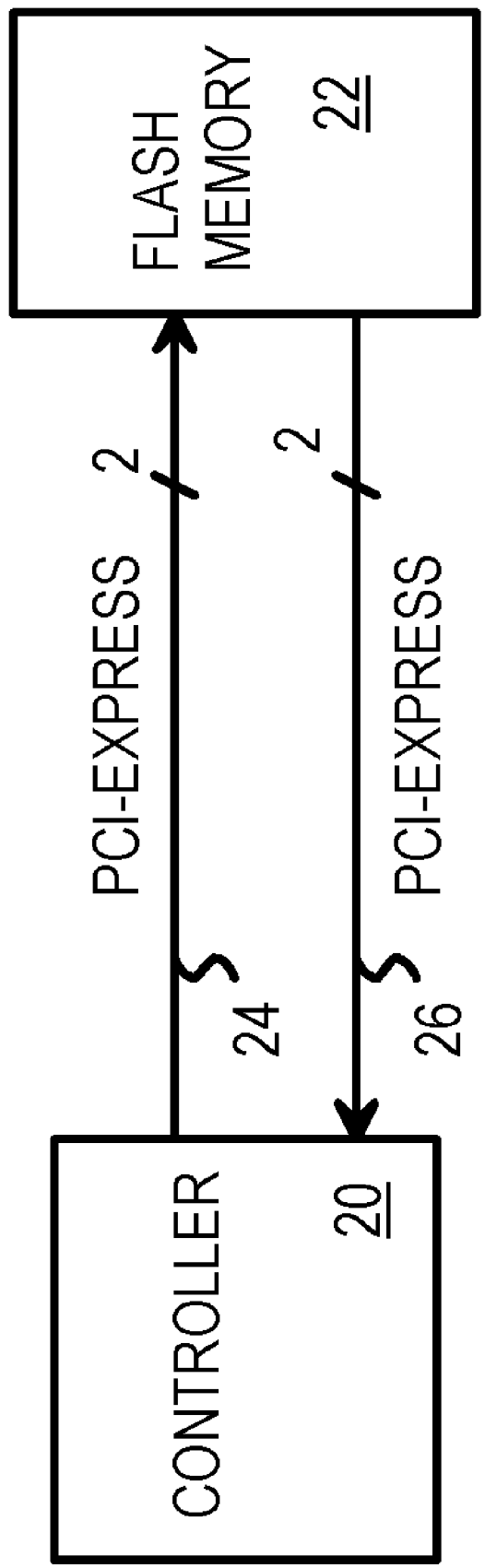
FIG. 2A is a block diagram of a serial interface to a flash-memory chip.

FIG. 2A is a block diagram of a serial interface to a flash-memory chip. Serial flash-memory chip 22 has a serial-bus external interface rather than an 8-bit I/O bus. Controller 20 also uses the serial-bus interface, generating serial-bus packets to access serial flash-memory chip 22. These serial-bus packets requesting access of serial flash-memory chip 22 are sent over input serial bus 24.

When data read from serial flash-memory chip 22 is ready to be sent back, serial flash-memory chip 22 packs this data in serial packets that are sent over output serial bus 26 to controller 20.

Figure 1:
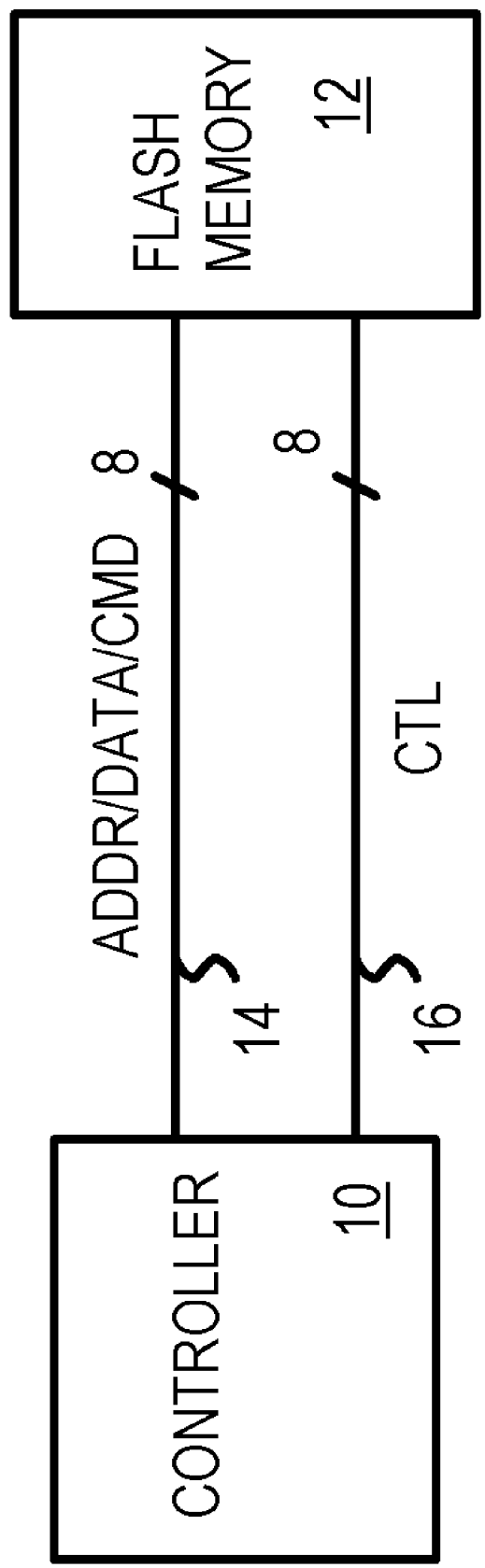
FIG. 1 shows a prior-art interface to a flash-memory chip.

In one embodiment, serial buses 24, 26 are a Peripheral Component Interconnect (PCI) Express bus. PCI express uses two lines per direction, including a transmit differential pair PET+, PET−, and a receive differential pair PER+, PER− of data pins. Thus a total of four signal lines are used by the serial-bus interface between serial flash-memory chip 22 and controller 20. Bi-directional data transmission is possible since separate transmit and receive lines are available. The pin count of serial flash-memory chip 22 and controller 20 can be reduced, since the serial interface uses only 4 pins compared to 16 or more pins for the parallel interface of FIG. 1. The total pin count may be ten or fewer external pins.

Figure 2B:
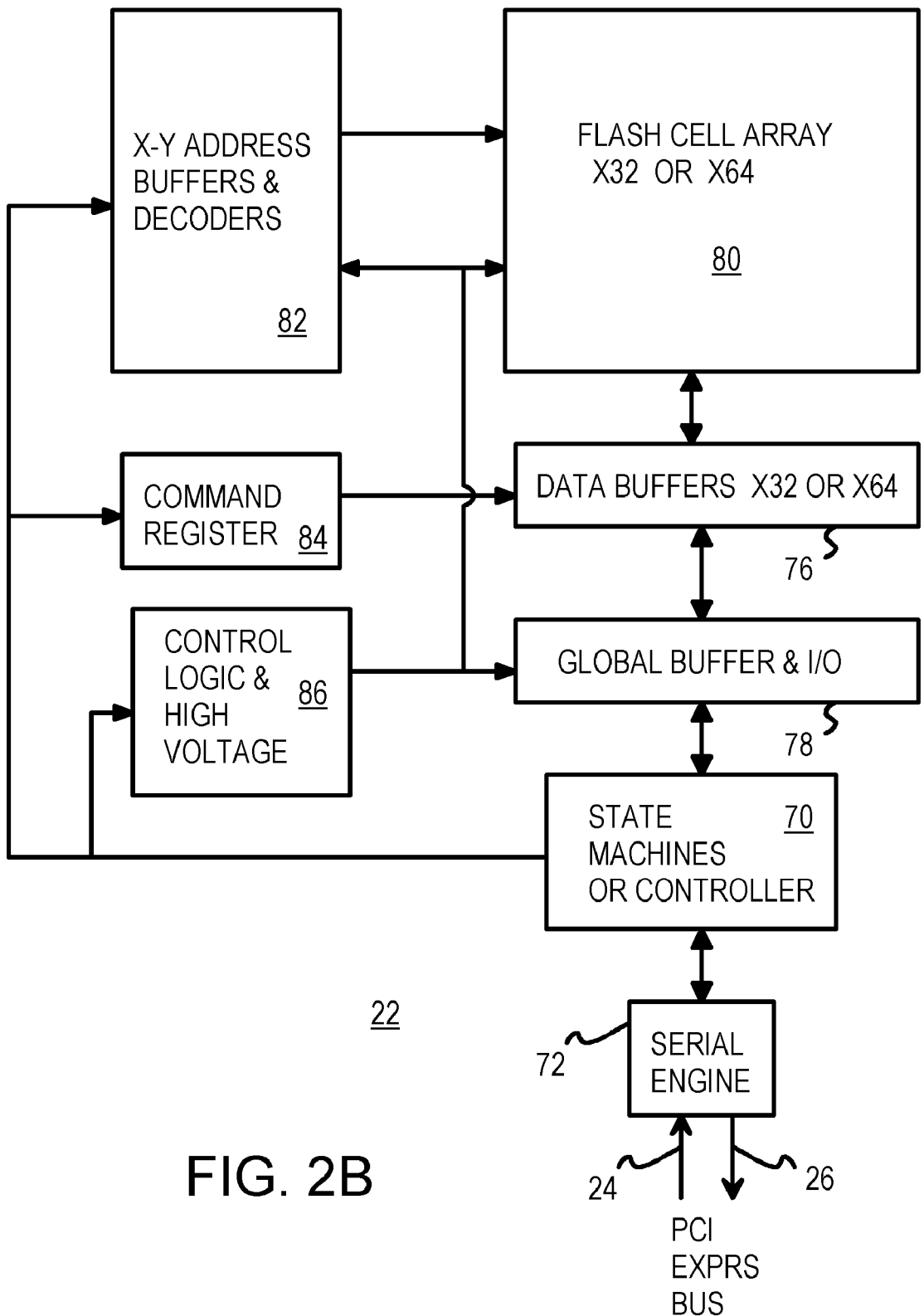
FIG. 2B shows an implementation of serial flash-memory chip in more detail.

FIG. 2B shows an implementation of serial flash-memory chip in more detail. Serial engine 72 receives data from the differential lines of input serial bus 24, and drives differential data onto output serial bus 26. Serial engine 72 can perform serial tasks such as timing, framing, start-detection, and checksum generation and verification. Data can be converted from serial to parallel formats and the clock can be extracted from the data stream.

Parallel data from serial engine 72 is communicated with state machines or microcontroller 70, such as over an internal parallel bus. Microcontroller 70 can perform a variety of tasks, such as routines to extract and decode commands embedded in serial packets received over input serial bus 24, and routines to read, write, and erase flash memory in response to these commands. Microcontroller 70 can include a programmable microcontroller, state machines, controller blocks, custom-logic blocks, or various combinations of these components.

Serial flash-memory chip 22 includes serial engine 72, microcontroller 70, and flash memory array 80 on the same semiconductor substrate or chip. Flash memory array 80 contains the flash or EEPROM memory cells arranged as data words that match the width of an internal flash bus, such as 32, 64, or 128 bits wide. Address signals for the rows and columns are generated by address buffers and decoder 82, which is loaded with an address that is sent over an internal bus from microcontroller 70.

A command sent from microcontroller 70 is latched into command register 84. This command is decoded and activates control logic 86 to carry out a sequence of operations and generate a sequence of internal control to perform the operation, such as reading or erasing memory cells or latching an address or reporting a status back. Higher programming and erase voltages may be generated. Flash memory array 80 may be powered down when not in use by a command from microcontroller 70.

Data written into serial flash-memory chip 22 arrives from serial engine 72 and microcontroller 70 and is latched by global buffer 78, which can allow the cache-write completion packet to be sent back. The data is then sent to data buffers 76 to be driven onto flash memory array 80 for storage. Data may be temporarily held in data/cache buffers 76 while being written to flash memory array 80.

An internal bus of 8 or more parallel bits can connect the flash memory block to microcontroller 70. Addresses, commands, and data from microcontroller can be transferred over this or other internal buses. Since the internal bus between microcontroller 70 and the flash memory block does not connect directly with chip pins, except perhaps for testing purposes, the pin count of serial flash-memory chip 22 is minimized.

Figure 3:
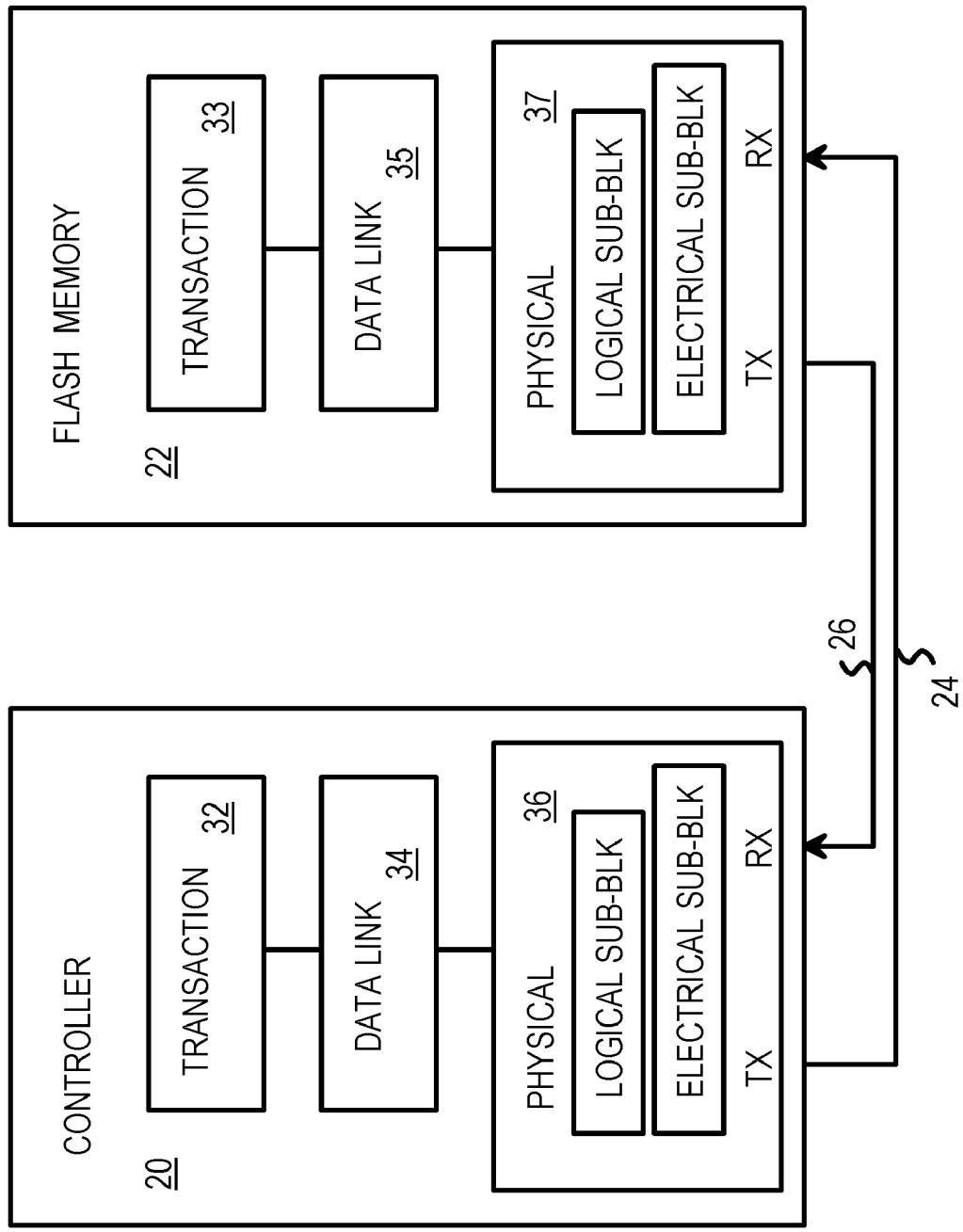
FIG. 3 is a layer diagram for communication over the serial bus to the serial flash-memory chip.

FIG. 3 is a layer diagram for communication over the serial bus to the serial flash-memory chip. Controller 20 generates and sends serial packets over the differential lines of input serial bus 24 to serial flash-memory chip 22, and serial flash-memory chip 22 generates reply packets that are sent over the differential lines of output serial bus 25 to controller 20.

The microcontroller, state machines, serial engine, or other logic in serial flash-memory chip 22 implements the functions of several layers of communication protocols. Serial packets using the PCI express protocol are generated by transaction layer 33 and data-link layer 35. Transaction layer 33 can append a header to the flash-memory or status data being transmitted, and can append error-check or recovery information such as a checksum. A packet sequence number and cyclical-redundancy-check (CRC) can be added by data-link layer 35. Data may be divided into multiple packets by the application software, transaction layer 33, or data-link layer 35 if needed.

Physical layer 37 handles physical transmission of the higher-level packets over the differential lines, and includes an electrical block with line drivers and receivers, and a logic block that can adjust bit timing, such as by bit stuffing and framing.

Controller 20 has similar layers, such as physical layer 36, data-link layer 34, and transaction layer 32. Serial engines can implement much of physical layers 36, 37, and perhaps some or all functions of data-link layers 34, 35. More sophisticated state machines or programmable logic or programs executed by microcontroller processors can implement functions of the higher-level transaction layers 32, 33.

Figure 4:
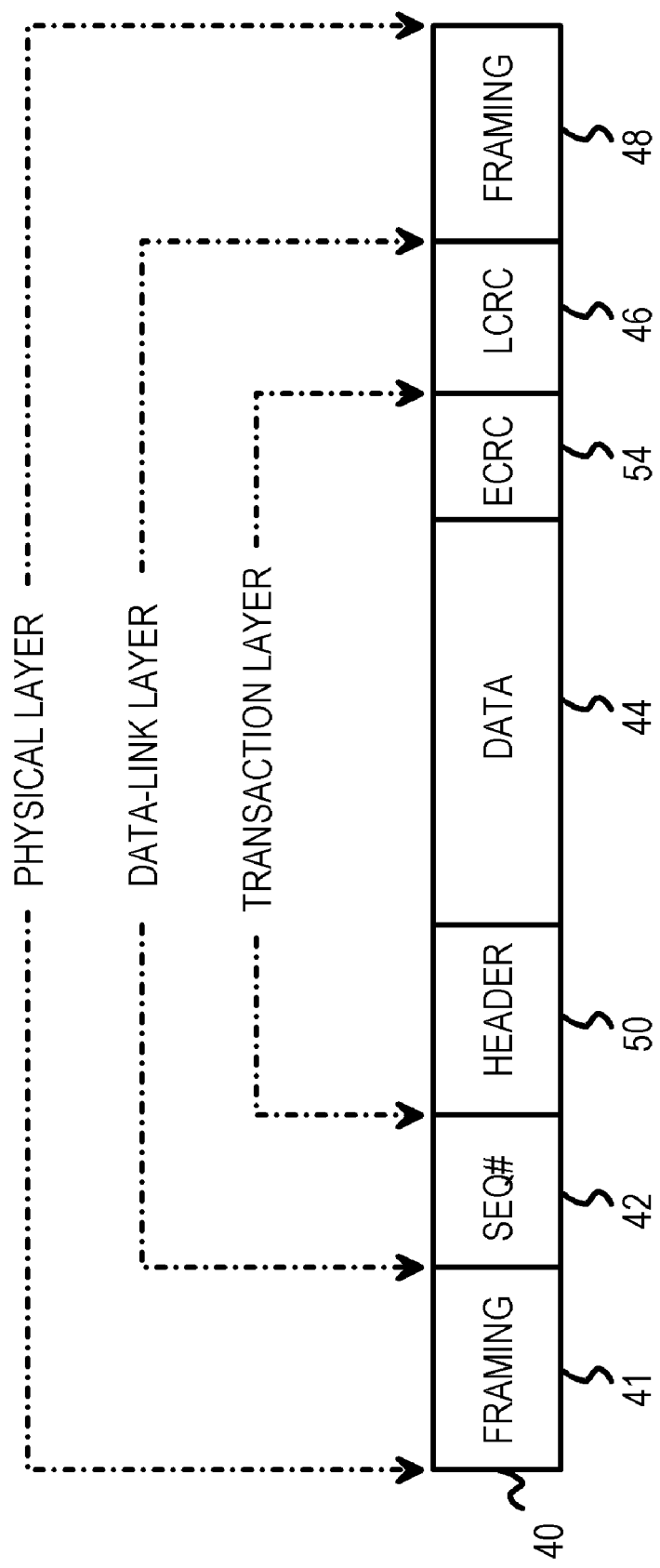
FIG. 4 is a diagram of serial-packet formation by the protocol layers of FIG. 3.

FIG. 4 is a diagram of serial-packet formation by the protocol layers of FIG. 3. Serial packet 40 could be a reply packet generated by serial flash-memory chip 22 with the flash data read from the flash-memory block. Data field 44 contains the flash-memory data requested by a read-request packet from controller 20. Status information from the flash-memory block could also be included in data field 44.

The transaction layer generates header 50 that is prepended to data field 44. A cyclical-redundancy-check (CRC) of data field 44 with header 50 can be generated by transaction layer 33 and attached as End-to-end CRC 54.

The transaction layer packet of header 50, data field 44 and ECRC 54 is sent to data-link layer 35.

Data-link layer 35 may optionally divide long transaction-layer packets into several packets, and attaches sequence number 42 to indicate where the current packet belongs in the sequence of serial packets. Another checksum or link CRC can be added by data-link layer 35, LCRC 46 to form the data-link layer packet.

The physical layer can add framing fields 41, 48. Framing fields 41, 48 delineate the physical packets. The bits starting with framing field 41, sequence number 42, header 50 are serially transmitted before data field 44 and the remaining checksums and framing is transmitted over the differential lines of the serial bus.

Figure 5:
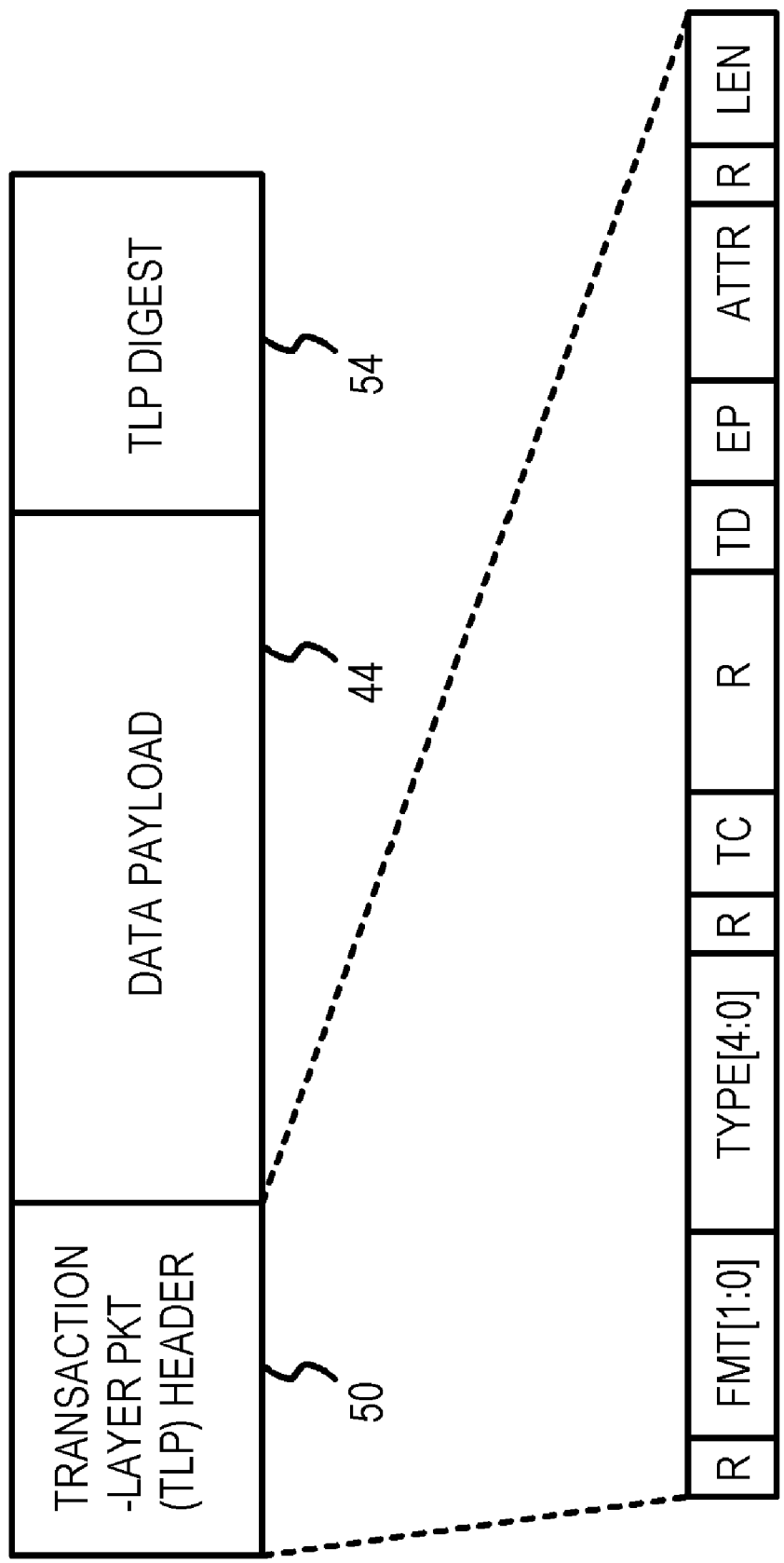
FIG. 5 shows a transaction-layer packet.

FIG. 5 shows a transaction-layer packet. Transactions following the PCI Express protocol have requests and completions that are communicated by packets. The packet formed by the transaction layer is known as a transaction-layer packet (TLP).

The data read from the flash memory, or the status reported by the flash memory, is contained in data field 44. For requests from the external controller, data field 44 contains data to write to the flash memory. Some packets may not have data field 44. Bytes are converted to serial data and transmitted over the serial bus in increasing order. The lowest byte is shown on the left and the highest byte on the right in the diagrams.

ECRC 54 can be a checksum or other digest information about data field 44. ECRC 54 can be four bytes in one embodiment. ECRC 54 can be compared to a checksum generated by the receiver to detect transmission errors.

Header 50 is generated by the transaction layer and follows the PCI Express protocol. Header can be 12 or 16 bytes in length. The first four bytes are shown, since all transaction-layer packet headers begin with the same format of the first four bytes. Later bytes in header 50 can vary in meaning depending on the type of packet.

Several bits in header 50 are reserved and shown as "R". A 2-bit format field FMT[1:0] defines the overall format of the transaction-layer packet. When FMT[1] is 0, the packet contains no data (data field 44 is absent); when FMT[1] is 1, the packet contains data field 44. When FMT[0] is 0, header 50 has 12 bytes; when FMT[0] is 1, header 50 has 16 bytes. Requests with two FMT values can use either 32 bit or 64 bit addressing packet formats.

Type field TYP[4:0] indicates the packet type, such as read or write requests, configuration reads or writes, messages, and completion packets with or without data. The format field can be used in conjunction with the type field to further define the packet type. For example, write request packets contain data field 44 and thus have FMT[0]=1, while reads have no data and thus have FMT[0]=0. Other fields may be present in header 50.

A 10-bit length (LEN) field contains the length of data field 44 as a number of 32-bit double-words. Data field 44 is aligned to double-word boundaries. The length field is reserved when the transaction-layer packet has no data field 44.

FIG. 6 is a table of transaction-layer packet types used for communicating with the serial flash-memory chip. Not all types of PCI Express packets are needed when communicating with serial flash-memory chip 22. Requests from the external controller to serial flash-memory chip 22 include memory-read, memory-write, configuration-read and configuration-write. Write request packets contain data field 44 and thus have FMT[0]=1, while reads have no data and thus have FMT[0]=0. Memory requests have type TYP[4:0] of 00000, while configuration requests have a type TYP[4:0] of 00101.

Serial flash-memory chip 22 responds to requests with completion packets. Completion packets have a type TYP[4:0] of 01010. Completion packets with data include data field 44 and thus have FMT[0]=1, while completion packets without data have no data field and thus have FMT[0]=0.

Message packets have a type TYP[4:0] of 10RRR, where the last 3 bits are reserved and can specify message routing information. These bits can also be used to select from among multiple chips for expansion such as in FIGS. 13.

FIG. 7 is a table of request and response packets used for various flash-memory commands. The center column of the table shows the request packet type while the last column shows the response packet type. The request packets are mostly from the external controller, while the response packets are mostly from the serial flash-memory chip.

When the external controller wants to read a block of data from the serial flash-memory chip, it initiates the flash-read command by sending a memory-read-request packet to the serial flash-memory chip. The serial flash-memory chip decodes the request, reads the data from the flash-memory block, and sends the flash-memory data back to the external controller in data field 44 in a completion-with-data packet. This basic flash-read command is shown in the first row of the table. The external controller sends a memory-read packet (first row of FIG. 6) while the serial flash-memory chip responds with a completion-with-data packet (last row of FIG. 6).

After writing to the flash memory, the serial flash-memory chip itself can verify that the data was written correctly and set an error flag in a status register when an error or a data mis-match is detected. The serial flash-memory chip then sends a vendor-defined message back to the external controller indicating success or failure of the write operation.

The second row of the table shows a read for copy back command. The external controller sends a read-request packet to the serial flash-memory chip. The read-request packet has a data length that matches the size of the status register, such as a length of one. The serial flash-memory chip performs the read-for-copy-back operation to the memory array by reading the data of the corresponding row into an internal buffer. After this operation is completed, it then reads its status register and copies the status register's contents to data field 44 that is sent back in a completion-with-data packet.

An identifier (ID) register on the serial flash-memory chip can be read by the external controller. To perform the flash "read ID" command, the external controller sends a configuration read request packet. The serial flash-memory chip reads its ID register and sends the data back in data field 44 in a completion-with-data packet.

A flash reset command can be used to reset the serial flash-memory chip. The external controller sends a message request packet to the serial flash-memory chip. The message packet contains a command to reset the serial flash-memory chip. No response from the serial flash-memory chip is needed.

To program data into the flash memory, the external controller loads the new data into data field 44 of a memory-write-request packet. The serial flash-memory chip decodes the command in the packet and writes the data to its flash-memory block. The serial flash-memory chip sends a message request packet to the external controller once programming is complete.

The actual physical programming of the flash-memory cells may take a relatively long time. The cache-program flash command is faster since the data is first written to a buffer in the serial flash-memory chip, then programmed into the flash-memory cells. The serial flash-memory chip sends a message-request packet as soon as the data is loaded into the buffer, but before the data has been programmed into the flash memory cells. Thus this message-request packet is returned more quickly for the cache-program command than the message packet is returned for the program command. The message-request packet has no data for the basic cache-program command.

Sometimes an entire block of flash data is to be erased. The flash erase command is sent from the external controller as a message request packet with a pre-defined encoding of reserved or vendor-defined bits. The serial flash-memory chip decodes these bits and executes an erase of a block of flash data. An erase operation can take a relatively long time, so the serial flash-memory chip later sends a message-request packet to the external controller once erase is complete.

The status register on the serial flash-memory chip can be read by the external controller sending a configuration-read-request packet. The serial flash-memory chip copies the data from the requested status register to data field 44 of a completion-with-data packet that is sent back to the external controller.

Figure 8:
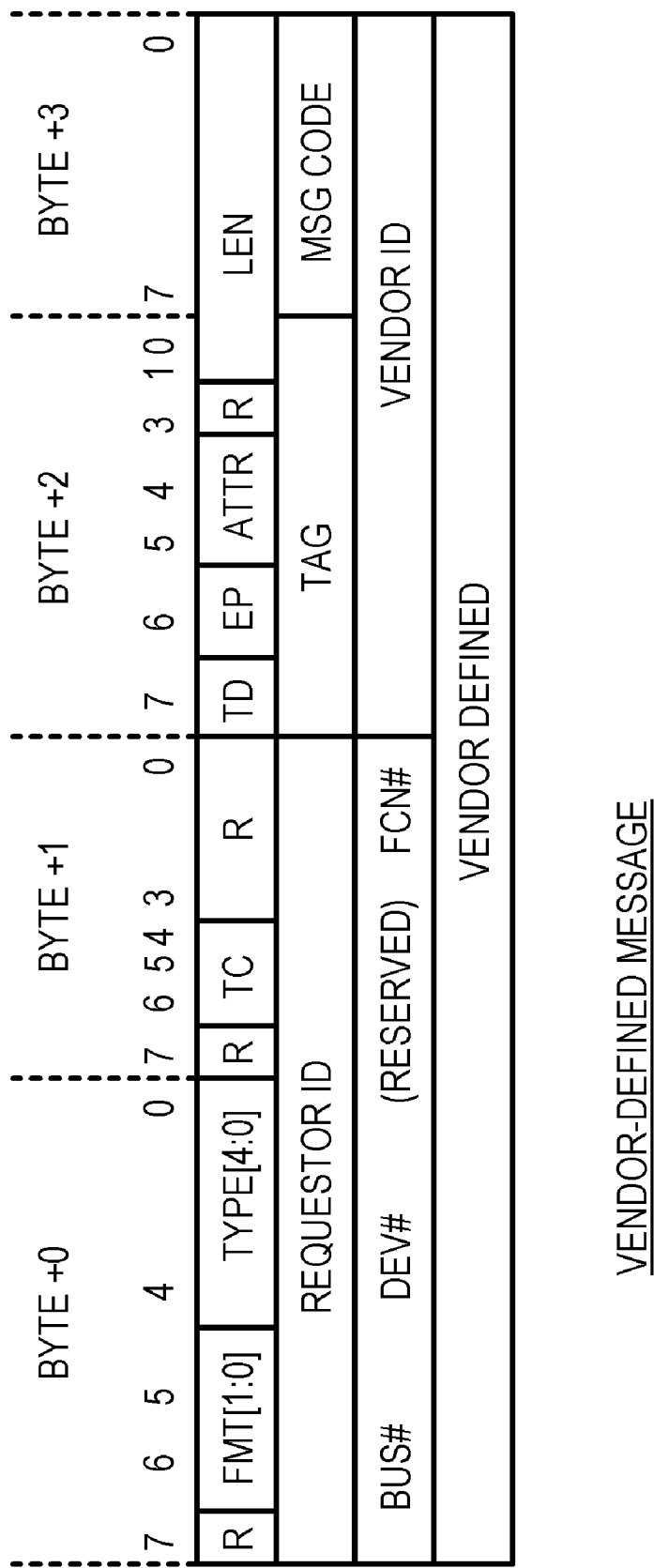
FIG. 8 shows a generic format for a vendor-defined message packet.

FIG. 8 shows a generic format for a vendor-defined message packet. The PCI Express protocol allows for a vendor-defined message. The header of this message contains format and type fields in byte 0 that defines the packet type as described earlier. Bytes 1, 2, and 3 of the header contain the required fields such as the attributes and length of data field 44.

An identifier for the requestor (the sender of the message packet) is loaded into bytes 4 and 5, while a tag and a message code can be placed in bytes 6 and 7 of the header. Bytes 8 and 9 are reserved for bus, device, and function identifiers, while bytes 10 and 11 contain an identifier for the vendor or manufacturer. The vendor can use bytes 12–15 of the header for information that the vendor defines. Bytes 12–15 are optional and are present when the format bit FMT[0] in byte 0 is 1. No data field 44 is used.

The vendor-defined message request packet can be sent by either the external controller or by the serial flash-memory chip. No response packet is needed. The vendor-defined message can be used for the flash-reset and flash-erase commands from the external controller, and for messages from the serial flash-memory chip that indicate final completion of all program and erase commands.

Vendor-define bytes 12–15 can be used to carry a 32-bit block address. For an erase command, bytes 12–15 carry the address of the block in flash memory to be erased. Since the entire block is erased, a full 32-bit address is not needed. The lowest bits of the 32-bit address can be used to define the type of flash command. For example, when address bits [2:0] are 001, the vendor-defined message packet requests a flash-erase operation, when address bits [2:0] are 000, the message is a flash-reset command, when address bits [2:0] are 010, the message is a completion-of-erase message from the serial flash-memory chip, and when address bits [2:0] are 011, the message is a completion-of-programming message from the serial flash-memory chip. The responses for Cache and Copy-Back Program commands can be defined similarly.

The completion status of an erase or program operation can be carried in bytes 12–15 for messages from the serial flash-memory chip. One of the bits in bytes 12–15 can be designated to carry a pass/fail flag. To enable pipeline operation, the program address is sent back to the external controller in bytes 12–15. Then bit 3 of the 32 bits can be used for the pass/fail status. The other bits can be used for the high-order program address.

Figure 9:
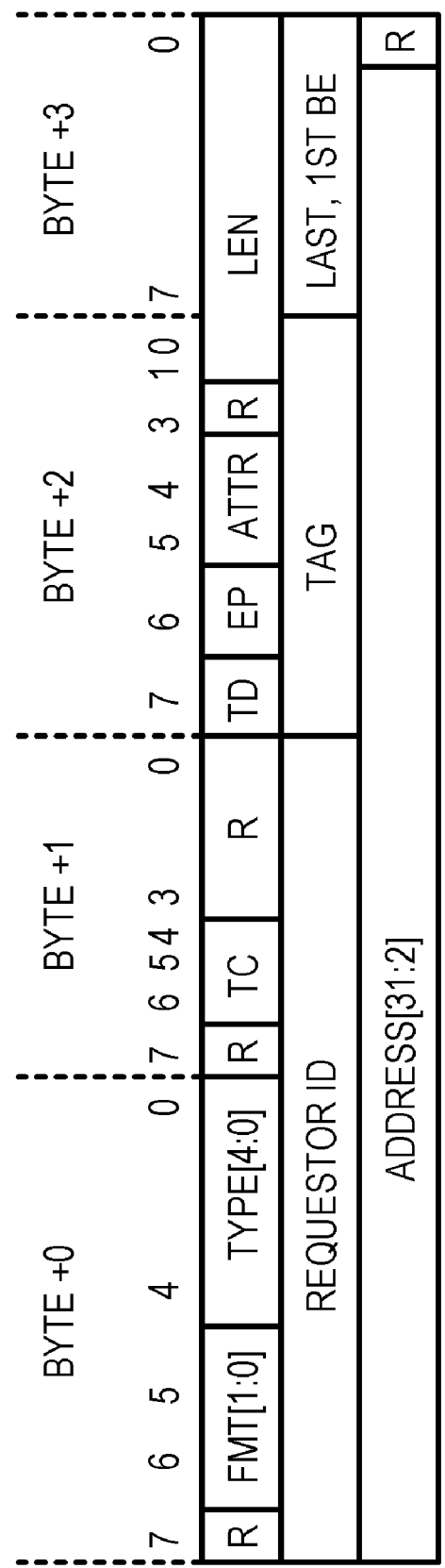
FIG. 9 shows a header for a memory-request packet.

FIG. 9 shows a header for a memory-request packet. Memory request packets are sent by the external controller and can request a read or a write. Byte 0 contains the format and type fields, which are set to one of the memory read or write values in the first two rows of FIG. 6. The format bit FMT[1] is 0 for read and 1 for write operations.

The length field in bytes 2, 3 contains the length of data field 44 in double-words. The requestor ID of the external controller is contained in bytes 4, 5, while the address of the data being read or written is placed in bytes 8–11. Byte-enables for the first 32 bit data and last 32 bit data being written can be placed in byte 7. A tag can be placed in byte 6 and can uniquely identify a transaction when combined with the requestor ID.

Because of the first and last byte enables in byte 7, the lower 2 address bits are not used for addressing. These lower 2 address bits can be used to carry other information. For example, address bit 0 can be set to 1 for the read-with-copy-back operation and set to 0 for the normal read operation.

For write operations, address bits ADDR[1,0] can be set to 00 for the flash-program operation, 01 for the cache-program operation, and 10 for the copy-back-program operation. Rather than use the lower address bits, other reserved bits could be used for operation encoding.

Figure 10:
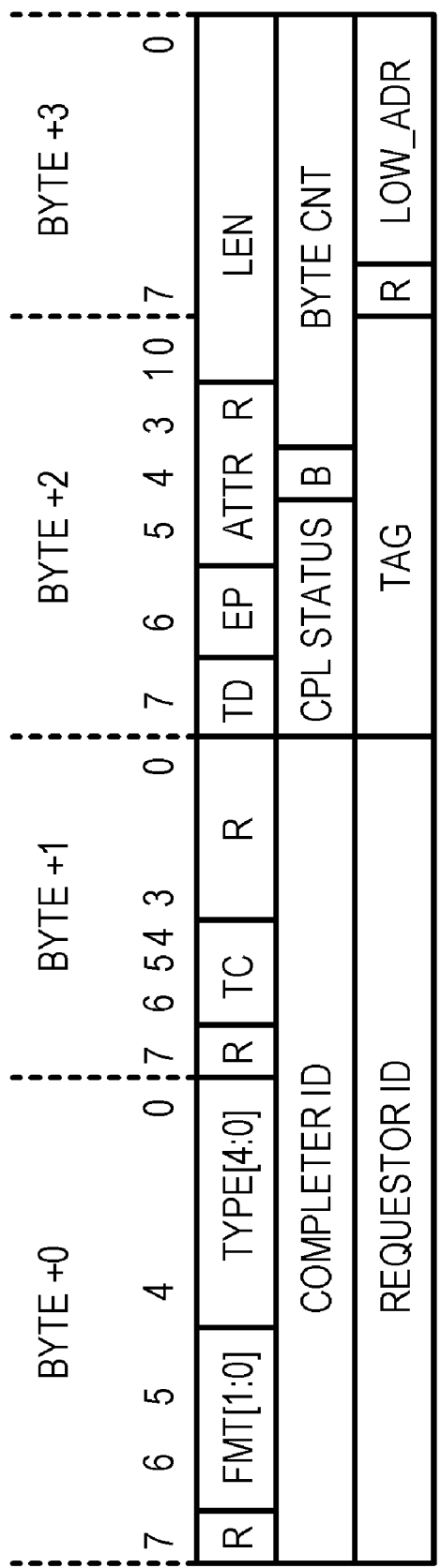
FIG. 10 shows a header for a completion packet.

FIG. 10 shows a header for a completion packet. Completion packets are generated by the serial flash-memory chip and sent back to the external controller in response to a request from the external controller.

Byte 0 contains the format and type fields, which are set to 01010 for completion packets, as shown in the last two rows of FIG. 6. The format bit FMT[1] is 0 for read and 1 for write operations. Read operations do not have data in their requests.

The length field in bytes 2, 3 contains the length of data field 44 in double-words. Some completion packets have no data and their length is set to 0. Completion-with-data packets have a length of 1 or more. The completer ID of the serial flash-memory chip is contained in bytes 4, 5, while the completion status and byte count may be placed in bytes 6–7.

The requestor ID of the external controller is contained in bytes 8, 9, while the low-order address or byte-enables of the data being read or written is placed in byte 11. A tag can be placed in byte 10 for uniquely identifying the transaction.

Figure 11:
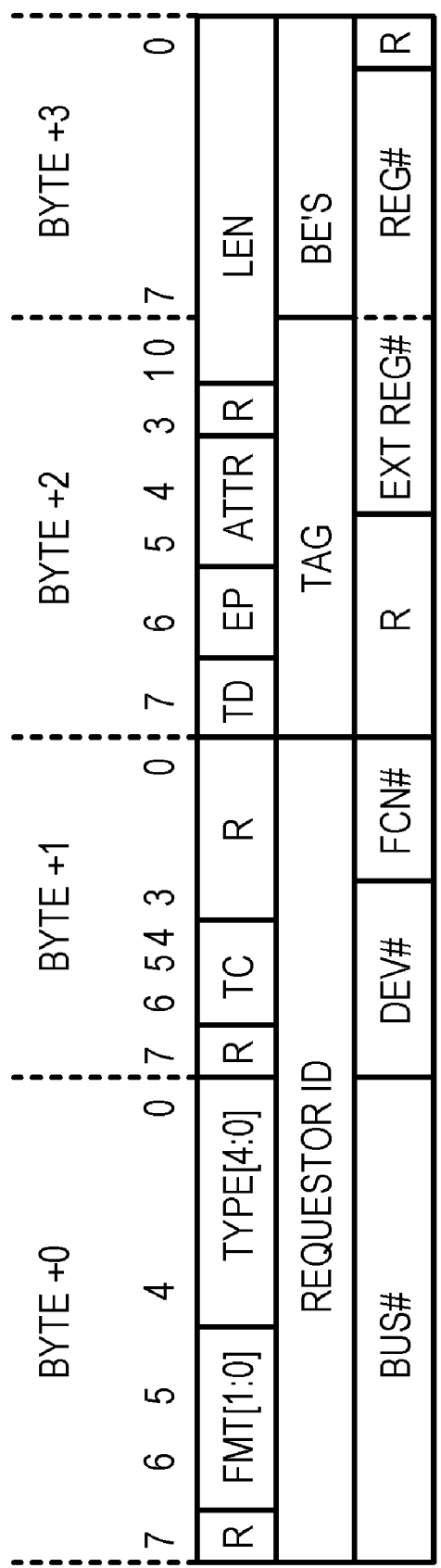
FIG. 11 shows a header for a configuration-request packet.

FIG. 11 shows a header for a configuration-request packet. Configuration-request packets are sent by the external controller to request reading or writing of a configuration register on the serial flash-memory chip. Byte 0 contains the format and type fields, which are set to the configuration packet values in the third and fourth rows of FIG. 6, TYPE[4:0]=00101. The format bit FMT[1] is 0 for a read request and 1 for write operations.

The length field in bytes 2, 3 contains the length of data field 44 in double-words. The requester ID of the external controller is contained in bytes 4, 5. Byte-enables for the data being written can be placed in byte 7. A tag can be placed in byte 6.

Identifiers for the serial bus, device, and function can be placed in bytes 8, 9. These identifiers can be generated by the external controller at run-time.

The serial flash-memory chip may have several configuration registers. An identifier for the configuration register in serial flash-memory chip can be placed in the register number field of byte 11. For example, register number 0 can be the ID register while register number 1 can be the status register. The flash read-ID command has its register number field set to 0 while the flash read-status command has its register number field set to 1.

The extension bits for the register number in byte 10 can be used if a large number of configuration registers are accessible in the serial flash-memory chip.

Figure 12:
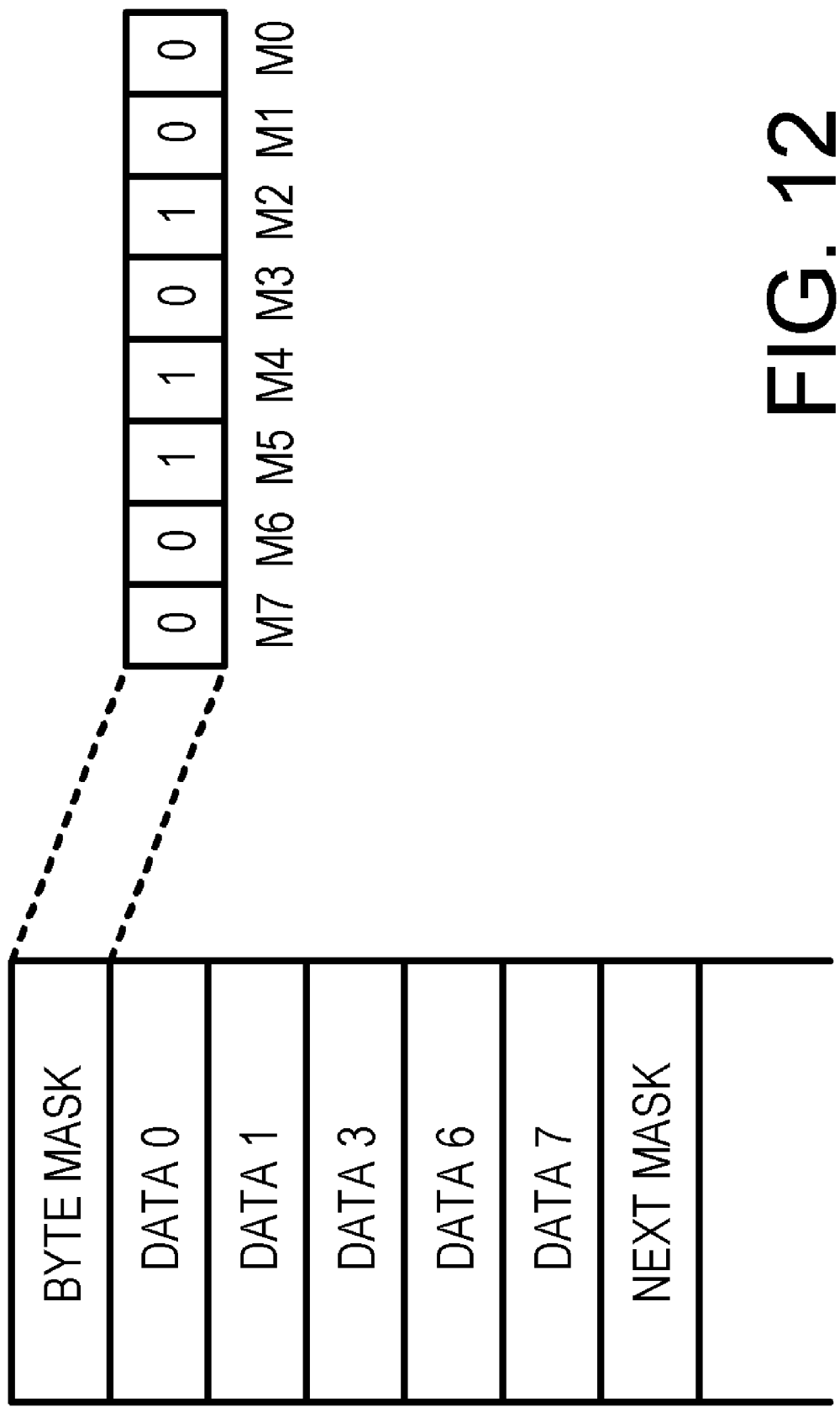
FIG. 12 shows packing of burst data.

FIG. 12 shows packing of burst data. One write request may contain many double-words of data in its data field. The length in the packet header is set to the number of double-words in the data field. The entire block of data bytes are written to the flash memory as a burst write using a single flash-write operation requested by the external controller.

Sometimes not all bytes in the block of data need to be written. For example, only 5 of the first 8 bytes need to be written, only 3 of the second 8 bytes, and only 4 of the third 8 bytes need over-writing, etc. Sending all 8 bytes of each pair of double-words is inefficient since the packet size is large enough to contain all bytes even though many of the bytes do not really need to be written. Sending only the bytes that need to be written can reduce packet size and bandwidth used on the serial bus.

Byte masks can be inserted into the data stream in data field 44. In the embodiment shown in FIG. 12, a byte mask is inserted for every 8 bytes of memory locations. Each of the 8 bits in the byte mask indicates the presence of one of the 8 bytes of memory locations in the flash memory.

In the example of FIG. 12, the initial byte in data field 44 is a byte mask with a value of 00110100. Since bits 5, 4, and 2 are set, these bytes are skipped. Five bytes follow the initial byte mask with the data to write for bytes 0, 1, 3, 6, and 7 of the first 8 bytes of flash memory addressed by the request packet. These five data bytes are followed by the second byte mask, which indicates which of the next 8 bytes of the flash memory are to be written.

Since data for bytes 5, 4, and 2 are not in data field 44, a net savings of 2 bytes occurs for the first 8 bytes. This is a compression of ⅔ or 25% using packed data in data field 44.

Packing of data field 44 using data bytes can be indicated in the packet header, or could be activated by setting a packed-data mode bit in a configuration register in serial flash-memory chip. A different packet type can be defined for packed data, such as type TYPE[4:0] being 11000 for a packed memory write while type TYPE[4:0] being 00000 is for a non-packed memory write or read.

FIGS. 13A–B show daisy-chain expansion with multiple serial flash-memory chips. Controller 20 could have multiple serial-bus pins to connect with multiple serial flash-memory chips in parallel. Unfortunately, this increases the pin count of the controller.

FIG. 13A show controller 20' connecting to three serial flash-memory chips 102, 103, 104 in a daisy chain. Each serial flash-memory chip 102, 103, 104 can include a serial-packet repeater and a second pair of serial-bus differential lines. Unused address bits or other unused bits in the header may be used as a device address to select from among serial flash-memory chips 102, 103, 104 as the destination.

FIG. 13B shows controller 20' connecting to three serial flash-memory chips 102, 103, 104 in a loop. The final serial flash-memory chips 104 can have its second serial-bus segments loop back to a second set of serial-bus inputs to controller 20". Packets can travel in the loop in either direction, allowing end devices such as serial flash-memory chips 104 to be reached more quickly.

Alternate Embodiments

Several other embodiments are contemplated by the inventors. For example rather than use a microcontroller, the serial flash-memory chip could use one or more state machines or specialized controllers or logic. The microcontroller could include internal program memory in RAM, ROM, or flash memory, and could contain an internal direct-memory access (DMA), I/O or flash-memory controller, address management logic, and internal buses.

The serial engine or microcontroller may encode the bytes of data in a variety of ways for transmission. Other formats of packed data can be used. Packet and header formats can vary, and some fields may hold dummy data. Rather than use 32-bit addressing, 64-bit addressing could be substituted.

Different numbers and arrangements of flash storage blocks can be included. Rather than use PCI Express, other serial buses may be used such as USB, Firewire (IEEE 1394), Serial ATA, Serial Attached Small-Computer System Interface (SA-SCSI), etc. Additional or fewer pins could be used for the interface.

The microcontroller or state machine components such as the serial engine, DMA, flash-memory controller, transaction manager, and other controllers and functions can be implemented in a variety of ways. Functions can be programmed and executed by the microcontroller's CPU or other processor, or can be implemented in dedicated hardware, firmware, or in some combination. Many partitioning of the functions can be substituted.

Other packet types or variations of these types can be defined for special purposes. Wider or narrower internal data buses and flash-memory blocks could be substituted, such as 8, 16, 32, 64, 128, 256-bit, or some other width data channels. Alternate bus architectures with nested or segmented buses could be used internal or external to the microcontroller. Two or more internal buses can be used in the microcontroller to increase throughput. More complex switch fabrics can be substituted for the internal buses.

The flash mass storage blocks can be constructed from any flash technology including NAND, NOR, AND, or multi-level-logic memory cells. Data striping could be used with flash mass storage blocks in a variety of ways, as can parity and error-correction code (ECC). The serial flash-memory chip can be integrated with other components or can be a stand-alone chip. Different flash commands can be used for different types of flash-memory blocks. Chip pins can be flat leads, solder balls, or many other equivalents.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A serial flash-memory chip comprising:
   a flash-memory array of electrically-erasable programmable read-only memory (EEPROM) cells;
   row and column decoders for selecting EEPROM cells in the flash-memory array for reading, writing, or erasing in response to a flash address;
   a serial-bus interface to a serial bus connected to pins of the serial flash-memory chip, for transmitting and receiving serial data over the serial bus;
   a serial engine, coupled to the serial-bus interface, for converting serial data from the serial bus to parallel data;
   an internal controller, coupled to the serial engine, for responding to flash commands sent over the serial bus in request packets, and for generating completion packets that are sent over the serial bus in response to the flash commands; and
   data buffers, coupled between the flash-memory array and the internal controller, for buffering data read from the EEPROM cells in response to the internal controller decoding a read flash command in a read-request packet, the data being loaded into a data payload of a completion packet;
   wherein the internal controller programs data into the EEPROM cells through the data buffers in response to a program flash command in a write-request packet received over the serial bus,
   whereby the serial flash-memory chip has a serial-packet interface for commands, address, and data.

2. The serial flash-memory chip of claim 1 wherein the write-request packet contains a program flash command;
   wherein the internal controller generates a vendor-defined message packet with a completion status for transmission over the serial bus after the EEPROM cells have been programmed, the vendor-defined message packet being part of a different serial-bus transaction than the write-request packet that initiated programming of the EEPROM cells;
   whereby the vendor-defined message packet is generated after completion of a program operation.

3. The serial flash-memory chip of claim 2 wherein the write-request packet contains a cache-program flash command;
   wherein the internal controller generates a message-request packet for transmission over the serial bus before completion of programming the EEPROM cells, the message-request packet being part of a same serial-bus transaction for the write-request packet that initiated programming of the EEPROM cells.

4. The serial flash-memory chip of claim 3 wherein an erase flash operation is initiated by the internal controller receiving an erase flash command in a vendor-defined message packet received over the serial bus;
   wherein the internal controller generates a second message packet for transmission over the serial bus after completion of the erase flash operation, the second message packet being part of a different serial-bus transaction than the vendor-defined message packet that initiated erasing of the EEPROM cells;
   whereby the second message packet is generated after completion of an erase flash operation.

5. The serial flash-memory chip of claim 2 wherein the internal controller resets the serial flash-memory chip in response to a reset-flash command in the vendor-defined message packet received over the serial bus.

6. The serial flash-memory chip of claim 5 wherein the internal controller generates a completion packet with a copy of a status register as a data payload in response to a configuration-read-request packet received over the serial bus;
   wherein the status register contains status flags or an identifier of the serial flash-memory chip.

7. The serial flash-memory chip of claim 5 wherein each packet sent or received over the serial bus contains a header having a type field and a format field that define a type and a format for each packet,
   wherein packet types include the read-request packet, the write-request packet, and a message packet sent to the serial flash-memory chip, and the completion packet and a message packet generated by the internal controller.

8. The serial flash-memory chip of claim 7 wherein the write-request packet contains a data payload containing data to program into the EEPROM cells, but the read-request packet contains no data payload;
   wherein the completion packet generated in response to the read-request packet contains a data payload containing data read from the EEPROM cells.

9. The serial flash-memory chip of claim 8 wherein the read-request packet contains the flash address that is sent to the row and column decoders to select data in the EEPROM cells for reading;
   wherein the write-request packet contains the flash address that is sent to the row and column decoders to select EEPROM cells for programming.

10. The serial flash-memory chip of claim 2 wherein the serial bus is a Universal-Serial-Bus (USB), a Peripheral Component Interconnect (PCI) Express bus, a Firewire IEEE 1394 bus, a Serial ATA bus, or a Serial Attached Small-Computer System Interface bus.

11. The serial flash-memory chip of claim 2 wherein the serial bus is a Peripheral Component Interconnect (PCI) Express bus that has pairs of differential lines including a transmit differential pair and a receive differential pair.

12. The serial flash-memory chip of claim 3 wherein the flash address has lower address bits that indicate when a flash command conveyed by the packet is the cache-program flash command, the program flash command, or a copy-back-program flash command;
    wherein the lower address bits are not necessary to uniquely locate EEPROM cells within the flash-memory array,
    whereby lower address bits in the flash address select a type of write operation.

13. The serial flash-memory chip of claim 2 wherein the internal controller comprises a microcontroller, a state machine, or a controller logic block.

14. A flash-memory chip with a serial-packet interface comprising:
    a serial-bus interface to an external serial bus that transfers serial packets that include a memory-read-request packet, a memory-write-request packet, a configuration-read-request packet, and an input message packet input to the flash-memory chip, and a completion packet and an output message packet output from the flash-memory chip;
    flash memory means for storing data in non-volatile flash-memory cells;
    controller means, coupled to the flash memory means and to the serial-bus interface, for performing operations identified by commands in the serial packets, the operations including:

reading data from the flash memory means at a flash address included in a header for the memory-read-request packet to generate a data payload for the completion packet;

writing data to the flash memory means at the flash address included in a header for the memory-write-request packet, the data being sent in a data payload in the memory-write-request packet;

reading a status from a configuration register identified by a header in the configuration-read-request packet to generate a data payload for the completion packet;

erasing a block of memory in the flash memory means in response to an erase indicator in a header in the input message packet and generating the output message packet once erasing is completed; and resetting the flash-memory chip in response to a reset indicator in a header in the input message packet, whereby operations are performed by the flash-memory chip in response to commands in serial packets received over the external serial bus include generation of completion packets with the data payload read from the flash memory means.

15. The flash-memory chip of claim 14 further comprising:

transaction-layer means, coupled to the controller means, for generating the completion packet by attaching a completion-packet header to the data payload, and for generating the output message packet by generating a message header indicating a completion status;

data-link layer means, coupled to the controller means, for encapsulating a transaction-layer packet generated by the controller means by adding a sequence number to a header and a checksum to generate a data-link packet; and physical-layer means, in the serial-bus interface, for framing the data-link packet for transmission over the external serial bus.

16. The flash-memory chip of claim 15 wherein the serial-bus interface connects to the external serial bus that is a bi-directional serial bus with an incoming pair of differential signal lines and an outgoing pair of differential signal lines.

17. The flash-memory chip of claim 15 wherein the serial-bus interface comprises no more than a plurality of four signal pins, the plurality of four signal pins being only pins to carry address, commands, and data to the flash-memory chip during normal operation;

wherein the flash-memory chip is in a package having ten or fewer external pins.

18. A Peripheral Component Interconnect (PCI) Express flash-memory chip comprising on a single semiconductor substrate:

a flash memory array of non-volatile electrically-erasable programmable read-only memory (EEPROM) cells;

address decoders, receiving a flash address, the address decoders selecting a subset of the EEPROM cells for reading, writing, or erasing;

a high-voltage generator for generating elevated voltages above a power-supply voltage for programming and erasing the EEPROM cells;

data buffers for storing data being written to the EEPROM cells;

a command register receiving a flash command;

control logic, responsive to the flash command in the command register, for controlling reading, writing, and erasing of the EEPROM cells;

a serial interface to external pins of the PCI Express flash-memory chip that connect to an external serial bus, the serial interface having a physical layer;

wherein the external serial bus is a PCI Express serial bus having differential data lines that carry data serially;

a controller, connected between the serial interface and the command register and data buffers, the controller comprising:

a data-link layer that encapsulates transaction-layer packets for transmission over the external serial bus after framing by the physical layer;

a transaction layer that generates headers to attach to data payloads to generate the transaction-layer packets;

read operation means, responsive to a memory-read-request packet received over the external serial bus having a header with the flash address, for sending a read command to the command register and sending the flash address to the address decoders, and transferring data read from the EEPROM cells from the data buffers to the transaction layer as a data payload, the transaction layer attaching the data payload to a header to generate a completion packet with the read data, the completion packet being sent over the external serial bus as a response to the memory-read-request packet;

program operation means, responsive to a memory-write-request packet received over the external serial bus having a header with the flash address, for sending a write command to the command register and sending the flash address to the address decoders, and transferring data write from a data payload of the memory-write-request packet to the data buffers for writing to the EEPROM cells;

erase operation means, responsive to a message packet received over the external serial bus having a header with an erase indicator, for sending an erase command to the command register, and generating a message packet for transmission over the external serial bus once the EEPROM cells have been erased; and reset operation means, responsive to a message packet received over the external serial bus having a header with a reset indicator, for sending a reset command to the control logic to reset the control logic and to reset the controller, whereby operations indicated by commands in serial packets received over the external serial bus are executed and data is returned in data payloads of serial packets.

19. The PCI Express flash-memory chip of claim 18 wherein the program operation means further comprises:

slow write means for generating a message packet for transmission over the external serial bus after writing to the EEPROM cells is completed, the message packet containing a completion status;

cached write means for generating a message packet for transmission over the external serial bus before writing to the EEPROM cells is completed;

wherein the read operation means further comprises:

register-read means, responsive to a configuration-read-request packet received over the external serial bus having a header with a register address, for transferring data read from a register to the transaction layer as a data payload, the transaction layer attaching the data payload to a header to generate a completion packet with the register data, the completion packet being sent over the external serial bus as a response to the configuration-read-request packet.

20. The PCI Express flash-memory chip of claim 18 further comprising:
packed-write means, coupled to the controller, for reading mask bytes in the data payload of the memory-write-request packet to determine locations of EEPROM cells for writing with data in data bytes in the data payload of the memory-write-request packet,
whereby the data payload is packed according to the mask bytes.

21. The PCI Express flash-memory chip of claim 18 further comprising:

an expansion serial interface to expansion external pins of the PCI Express flash-memory chip that connect to an external expansion serial bus, the expansion serial interface having a physical layer;

wherein the expansion external serial bus is a PCI Express serial bus having differential data lines that carry data serially to a second PCI Express flash-memory chip.

\* \* \* \* \*